United States Patent
Tanaka et al.

[11] Patent Number: 6,100,613
[45] Date of Patent: Aug. 8, 2000

[54] COMPACT RECTIFIER USED IN AUTOMOBILE AC GENERATOR

[75] Inventors: Kazunori Tanaka; Katsumi Adachi, both of Tokyo, Japan

[73] Assignee: Mistubishi Denki Kabushiki Kaisha, Tokyo, Japan

[21] Appl. No.: 09/141,553

[22] Filed: Aug. 28, 1998

[30] Foreign Application Priority Data

Feb. 26, 1998 [JP] Japan .................................. 10-045166

[51] Int. Cl.[7] .................................................. H02K 11/04
[52] U.S. Cl. ........................ 310/68 D; 310/68 R; 310/71
[58] Field of Search ............................... 310/68 D, 67 R, 310/71, 68 R; 363/144, 145, 146

[56] References Cited

U.S. PATENT DOCUMENTS

| 4,189,653 | 2/1980 | Hiratuka et al. ................. 310/68 D |
| 5,682,070 | 10/1997 | Adachi et al. ....................... 310/71 |
| 5,694,313 | 12/1997 | Ooiwa ................................. 363/145 |
| 5,729,063 | 3/1998 | Adachi et al. .................... 310/68 D |
| 5,742,498 | 4/1998 | Taniguchi et al. ................. 363/145 |

FOREIGN PATENT DOCUMENTS

| 671 803 | 9/1995 | European Pat. Off. ....... H02K 11/04 |
| 720 273 | 7/1996 | European Pat. Off. ....... H02K 11/04 |
| 751 609 | 1/1997 | European Pat. Off. ....... H02K 19/22 |
| 757 423 | 2/1997 | European Pat. Off. ....... H02K 11/04 |
| 39 18767 | 12/1989 | Germany ....................... H01L 23/36 |
| 5-176539 | 7/1993 | Japan .............................. H02M 7/04 |
| WO 85/00254 | 1/1985 | WIPO ............................. H02K 19/38 |

*Primary Examiner*—Nestor Ramirez
*Assistant Examiner*—Burton Mullins
*Attorney, Agent, or Firm*—Sughrue, Mion, Zinn, Macpeak & Seas, PLLC

[57] ABSTRACT

In this compact rectifier, a arcuate bodies of a positive heat sink and a arcuate body of a negative heat sink are arranged in a coaxial manner while positioning major surfaces thereof at the same plane position. A plurality of positive diodes are mounted on the major surface of the arcuate body of the positive heat sink along the circumferential direction in such a manner that leads are directed toward an outer circumferential side. On the other hand, while a plurality of negative diodes offset by a preselected amount along the circumferential direction with respect to the positive diodes with directing the lead to an inner circumferential side, these plural negative diodes are mounted on the major surface of the arcuate body of the negative heat sink.

2 Claims, 6 Drawing Sheets

COMPACT RECTIFIER USED IN AUTOMOBILE AC GENERATOR

BACKGROUND OF THE INVENTION

1. Field of the Invention

The present invention relates to a rectifier for an automobile AC generator mounted on an engine of an automobile.

2. Description of the Related Art

FIG. 6 schematically shows a structure of an automobile AC generator 100.

In FIG. 6, a stator 1 is constructed of a stator core 2 and a stator coil 3 wound on this stator core 2. A rotor 4 is constituted by one pair of pole cores 5 and 6 located opposite to each other; an excitation coil 7 wound between the cores 5 and 6; a rotation shaft 8; and a slip ring 9 fixed on this rotation shaft 8. Then, a rear bracket 13 is fixed to a front bracket 12 by a fastening bolt 14, so that the stator 1 is supported between the front bracket 12 and the rear bracket 13. The rotation shaft 8 is supported via bearings 15 and 16 by the front bracket 12 and the rear bracket 13.

A pulley 17 is fixed to one end of the rotation shaft 8. A rectifier 18 is mounted on the rear bracket 13, and is electrically connected to an output terminal of the stator coil 3 so as to convert AC power generated by the stator 1 into DC power. A voltage regulator 19 is mounted to the rear bracket 13 in connection with a brush holder 20. The brush holder 20 supports a brush 21 in such a manner that this brush 21 abuts against the slip ring 9.

In the automobile AC generator 100 constituted in the above-described manner, a current is supplied via the brush 21 and the slip ring 9 to the excitation coil 7, and at the same time, rotation torque of an engine is transmitted via the pulley 17 and a belt (not shown) to the rotation shaft 8, so that the rotor 4 is rotary-driven. As a result, the stator 1 may generate AC power. Then, this AC power is converted into DC power by the rectifier 18.

Referring now to FIG. 7 to FIG. 10, the structure of this rectifier 18 will be described.

The rectifier 18 is arranged by a positive heat sink 30 on which a plurality of positive diodes 33 are mounted, a negative heat sink 31 on which a plurality of negative diodes 34 are mounted, and a circuit board assembly 32.

The positive heat sink 30 is made of aluminium. This positive heat sink 30 contains a arcuate body 30a, a plurality of heat radiating fins 30b, positioning guide portions 30c, and a plurality of positive diode mounting portions 30d. The plural heat radiating fins 30b stand upright on a rear surface of this arcuate body 30a. The positioning guide portions 30c are extended from three portions of this arcuate body 30a, namely both ends and a center of the arcuate body, outwardly along a radial direction. The plural positive diode mounting portions 30d are formed as concaves in a major surface of the arcuate body 30a along a circumferential direction thereof. Then, a plurality of positive diodes 33 are mounted on the major surface of the arcuate body 30a in such a manner that these positive diodes 33 are joined to the respective positive diodes mounting portions 30d.

The negative heat sink 31 is made of aluminum, and contains another arcuate body 31a, guide portions 31b, and a plurality of negative diode mounting portions 31c. The guide portions 31b are provided on three portions of this arcuate body 31a, namely both ends and a center portion thereof. The plural negative diode mounting portions 31c are formed as concaves on a major surface of the arcuate body 31a along a circumferential direction. Then, a plurality of negative diodes 34 are mounted on the major surface of the arcuate body 31a along the circumferential direction in such a manner that these diodes 34 are joined to the respective negative diode mounting portions 31c.

The circuit board assembly 32 is constructed of a resin member 36 formed in a arcuate shape and guide portions 36a formed on three portions of this resin member 36, i.e., both ends and a center portion thereof. This resin member 36 is made of an iron circuit board molded by polyphenylene sulfide resin (PPS). Then, connection terminals 37 of the circuit board assembly 32 are downwardly projected from the resin member 36 at a plurality of positions thereof along a circumferential direction.

The positive diode 33 is constituted in such a manner that an IC chip 33a is soldered on a copper base 33b to be joined, a relay lead 33c made of copper is soldered on the IC chip 33a to be joined, and further a lead 33d made of copper is soldered on the relay lead 33c to be joined, and these members are molded by resin. Then, the lead 33d is extended from a sealing resin member 33e, and is bent in an L-shape on the root side of the extended lead portion. Also, the negative diode 34 is formed in a similar manner to the above-explained positive diode 33.

In this case, the rectification performance of the rectifier 18, namely the performance of the diode may be substantially determined from the area of the IC chip. In general, this IC chip is formed as a square in view of the performance, the reliability, and the sealing characteristic and the productivity required when the peripheral portion of the IC chip is molded to constitute the diode. Such a square-shaped IC chip is overlapped with a frame for mounting a lead, and then is molded to manufacture a diode. A main body of this diode becomes a rectangular parallelepiped. A projection direction of the lead corresponds to a longitudinal direction. Also, this lead is projected at a right angle from one side among four sides, and a tip portion of this projected lead is bent perpendicular to the projection direction in order that this lead can be firmly connected to a frame functioning as a connection portion, and also sufficient strength can be achieved.

To assemble the rectifier 18 constituted in the above-described manner, while the lead 33d of the positive diode 33 is directed toward an outer circumference side, the copper base 33b is soldered/jointed to each of the positive diode mounting portions 30d of the positive heat sink 30. Similarly, while a lead 34d of the negative diode 34 is directed toward an inner circumference side, a copper base 34b is soldered/jointed to each of the negative diode mounting portions 31c of the negative heat sink 31. Then, the guide portions 30c of the positive heat sink 30 are overlapped via an insulating ring 35 to the guide portions 31b of the negative heat sink 31. Furthermore, the guide portions 36a of the circuit board assembly 32 are overlapped on the guide portion 30c of the positive heat sink 30. Thereafter, fastening bolts (not shown) are inserted under pressure into holes of the guide portions 30c, 31b, 36a, so that the positive heat sink 30, the negative heat sink 31, and the circuit board assembly 32 are positioned to be formed in an integral form.

At this time, the arcuate body 30a of the positive heat sink 30 is positioned on the inner circumferential side of the arcuate body 31a of the negative heat sink 31, and the major surfaces of both the arcuate bodies 30a and 31a are located at the same plane. Also, the lead 33d of the positive diode 33 is located opposite to the lead 34d of the negative diode 34, and the connection terminal 37 of the circuit board assembly 32 is interposed between the lead 33d and the lead 34d facing each other, respectively.

Then, the lead 33d of the positive diode 33, the lead 34d of the negative diode 34, and the connection terminal 37 of the circuit board assembly 32 are integrally joined with each other by means of the projection welding from both sides, so that the rectifier 18 is assembled.

The rectifier 18 assembled in the above-explained manner is mounted on a rear bracket 13 in a coaxial manner to a rotation shaft 8 in such a way that an inner circumferential edge surface of the arcuate body 30a of the positive heat sink 30 is positioned along a slip ring 9 of the rotation shaft 8.

As described above, since the rectifier of the automobile AC generator is arranged in such a coaxial manner to the rotation shaft 8 in order that the arcuate body 30a of the positive heat sink 30 may maintain a preselected clearance with respect to the slip ring 9 of the rotation shaft 8, the inner diameter of the arcuate body 30a of the positive heat sink 30 is determined by the outer diameter of the slip ring 9.

In other words, the inner diameter of the arcuate body 30a of the positive heat sink 30 becomes a fixed value. Then, in the conventional rectifier 18, the arcuate body 30a of the positive heat sink 30 is coaxially arranged with the arcuate body 31a of the negative heat sink 31 and further arrayed along the radial direction. In addition, the lead 33d of the positive diode 33 is so arranged as to abut against the lead 34d of the negative diode 34.

Therefore, the dimension of the conventional rectifier 18 along the radial direction requires at least a sum between the length of the positive diode 33 and the length of the negative diode 34. As a result, there is a problem that the conventional rectifier 18 cannot be made compact while maintaining the required performance.

Also, to realize compactness of the conventional rectifier 18, when the bending position of the lead 33d (34d) which is extended from the sealing resin member 33e (34e) and thereafter is bent in the L-shape is located close to the sealing resin member 33e (34e), the excessive stress is applied to the IC chip 33a (34a) while the lead 33d (34d) is bending-processed. In addition, the vibrations produced by the automobile are transferred to the lead 33d (34d), and therefore force is concentrated at the root portion of the lead 33d (34d). As a consequence, there is another problem that breakage failures readily occur in the leads and the IC chip, and thus the reliability is deteriorated.

On the other hand, under such a condition that the connection terminal 37 of the circuit board assembly 32 is sandwiched between the lead 33d of the positive diode 33 and the lead 34d of the negative diode 34, these connection terminal 37, lead 33d, and 34d are welded from both side by means of the projection welding. As a result, the heat generated at the boundary surfaces between the leads 33d, 34d and the connection terminals 37 when the different sorts of metals are joined with each other by means of the projection welding is diffused into the connection terminal 37, so that the heat is reserved into the center portion of the connection terminal 37 to thereby increase the temperatures of the connection terminal 37. Accordingly, a cavity is produced in the center portion of the connection terminal 37, so that the reliability is deteriorated. Under such a circumstance, the following alternative idea may be conceived. That is, in order to avoid that the cavity is produced in the center portion of the connection terminal 37, the thickness of the connection terminal 37 is made thicker. However, this alternative idea may cause the dimension of the conventional rectifier along the radial direction to be increased. Therefore, the down-sizing of a compact rectifier cannot be achieved.

SUMMARY OF THE INVENTION

The present invention has been made to solve the above-described problems, and therefore, has an object to provide a compact rectifier of an automobile AC generator, capable of increasing reliability thereof, while maintaining required performance.

To achieve the above-described object, a rectifier of an automobile AC generator, according to one aspect of the present invention, is featured by comprising: a first metal heat sink having a arcuate body and a guide portion formed on the arcuate body in an integral body; a second metal heat sink having a arcuate body and a guide portion formed on the arcuate body in an integral body, the second metal heat sink being coaxially arranged with the first metal heat sink in such a manner that the guide portion thereof is overlapped via an insulating member over the guide portion of the first metal heat sink, a major surface of the arcuate body thereof is positioned at the same plane as a major surface of the arcuate body of the first metal heat sink, and an inner circumferential end surface of the arcuate body thereof is positioned opposite to an outer circumferential end surface of the arcuate body of the first metal heat sink; a circuit board assembly having a circuit board containing a plurality of connection terminals, a arcuate resin member for molding the circuit board in such a manner that the plurality of connection terminals are exposed, and a guide portion formed on the resin member in an integral body, the circuit board assembly being arranged in such a manner that the guide portion thereof is overlapped with one of the guide portions of the first and second metal heat sinks, and the resin member is positioned opposite to the major surfaces of both the arcuate bodies of the first and second metal heat sinks; a plurality of positive diodes mounted on the major surface of one heat sink between the first and second metal heat sinks along a circumferential direction, each of the positive diodes having a metal base, an IC chip joined onto the metal base, a sealing resin member for molding the IC chip, and a lead whose one end is electrically connected to the IC chip and the other end is extended from the sealing resin member, the metal base being joined onto the major surface of the arcuate body of the one heat sink, and the other end of the lead being joined onto the connection terminal of the circuit board; and a plurality of negative diodes mounted on the major surface of the other heat sink between the first and second metal heat sinks along a circumferential direction, each of the negative diodes having a metal base, an IC chip joined onto the metal base, a sealing resin member for molding the IC chip, and a lead whose one end is electrically connected to the IC chip and the other end is extended from the sealing resin member, the metal base being joined onto the major surface of the arcuate body of the other heat sink, the other end of the lead being joined onto the connection terminal of the circuit board; in which the rectifier is coaxially mounted on a rotation shaft of the AC generator in such a manner that the major surfaces of the arcuate bodies of the first and second metal heat sinks are intersected at a right angle with an axis of the rotation shaft of the AC generator; wherein: each of the connection terminals of the circuit board is branched to be exposed on an inner circumferential side and an outer circumferential side of the resin member; each of leads of the diodes mounted on the major surface of the arcuate body of the first metal heat sink along the circumferential direction is extended from the sealing resin member along a direction of the arcuate body of the second metal heat sink, and thereafter is bent in a direction along which the lead is separated from the major surface of the arcuate body of the second metal heat sink, and other end thereof is joined onto an exposed portion of the connection terminal exposed on the outer circumferential side of the resin member; and each of the diodes mounted on the major surface of the arcuate body of the second metal heat sink along the circumferential direction is offset along the circumferential direction with respect to each of the diodes mounted on the major surface of the arcuate body of the first metal heat sink, respectively, each of the leads thereof is extended from the sealing resin member along the arcuate body of the first metal heat sink, and thereafter is bent in a direction along which the lead is separated from the major surface of the arcuate body of the first metal heat sink, and other end thereof is joined onto an exposed portion of the connection terminal exposed on the inner circumferential side of the resin member.

BRIEF DESCRIPTION OF THE DRAWINGS

For a better understanding of the present invention, reference is made of a detailed description to be read in conjunction with the accompanying drawings, in which.

DETAILED DESCRIPTION OF THE REFERRED EMBODIMENTS

Referring now to drawings, rectifiers according to various preferred embodiments of the present invention will be described in detail.

Embodiment 1

Figure 1:
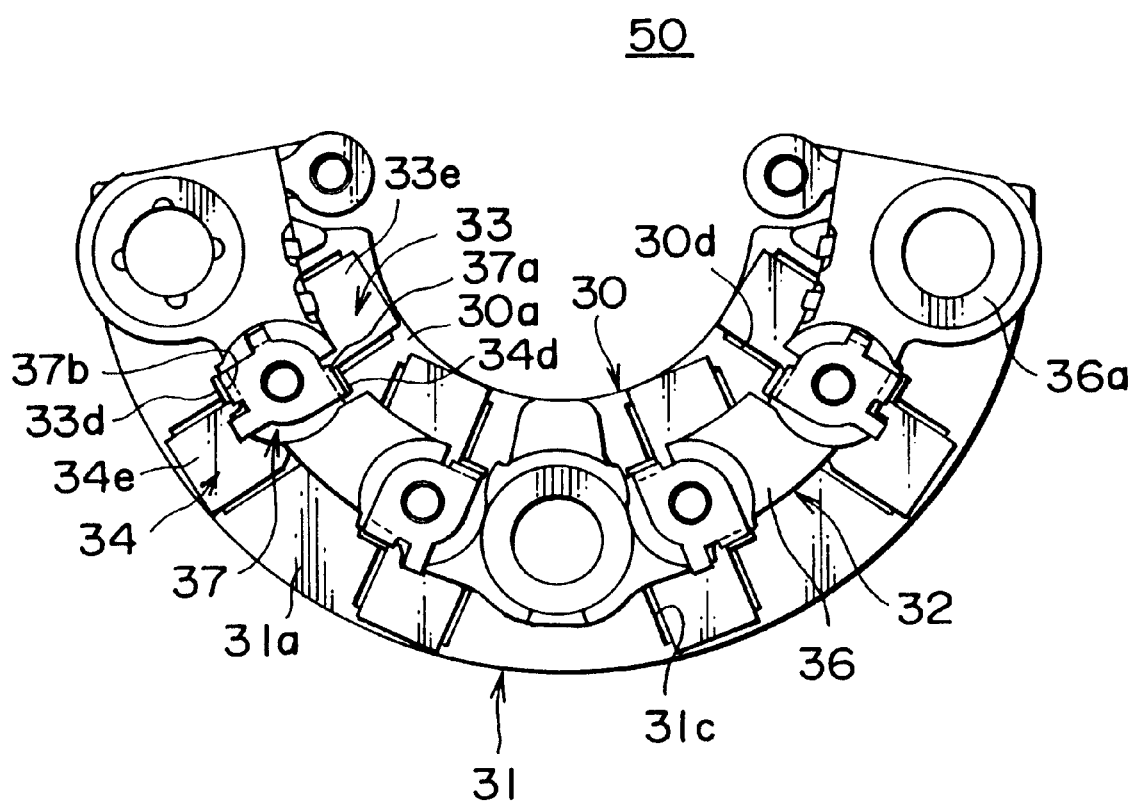
FIG. 1 is a plan view for indicating a rectifier according to an embodiment 1 of the present invention.
Figure 2:
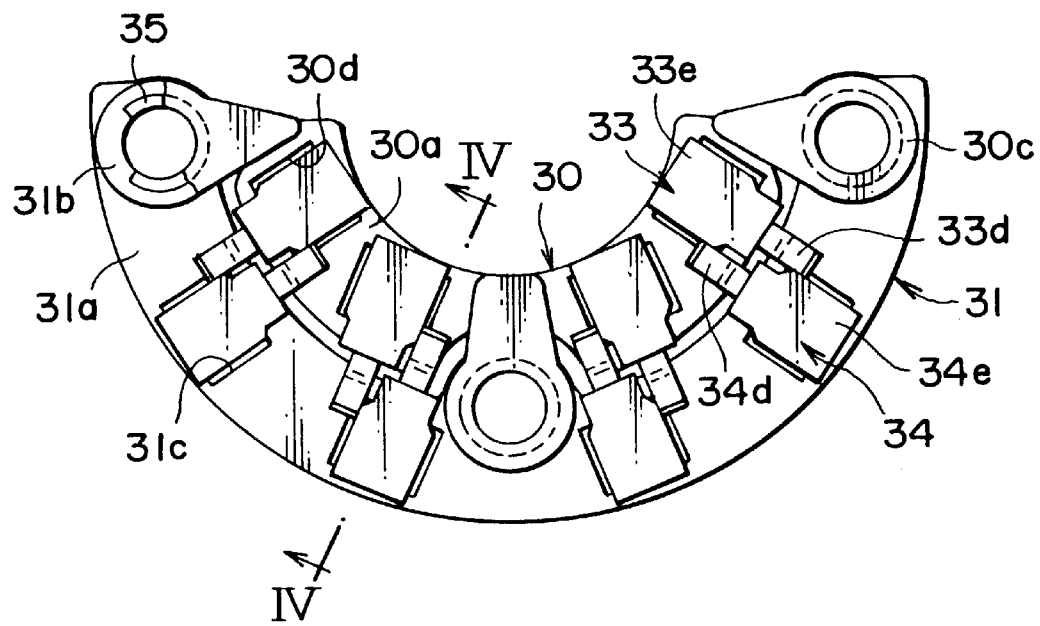
FIG. 2 is a plan view for representing such a condition that a circuit board assembly has been removed from the rectifier shown in FIG. 1.
Figure 3:
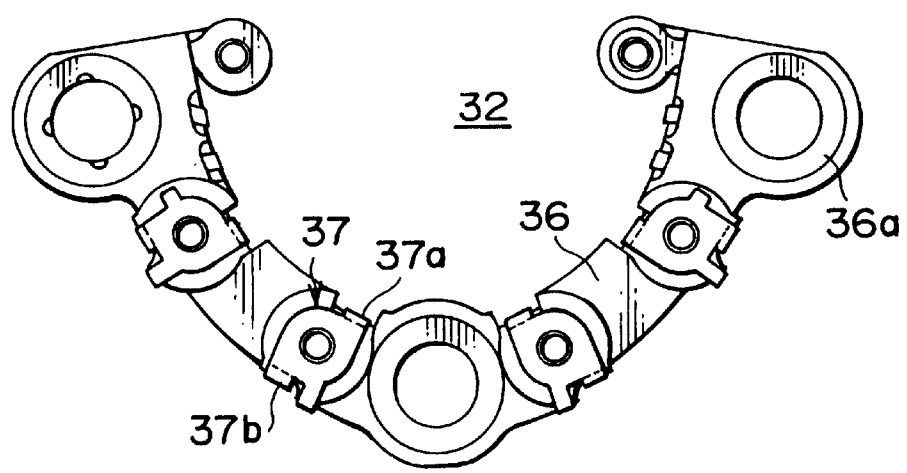
FIG. 3 is a plan view for showing the circuit board assembly employed in the rectifier indicated in FIG. 1.
Figure 4:
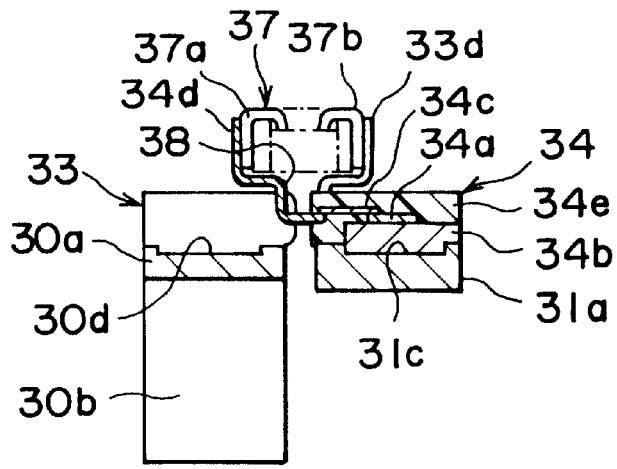
FIG. 4 is a sectional view of the rectifier shown in FIG. 2, taken along a line IV—IV of FIG. 2.

FIG. 1 is a plan view for indicating a rectifier according to an embodiment 1 of the present invention. FIG. 2 is a plan view for representing such a condition that a circuit board assembly has been removed from the rectifier shown in FIG. 1. FIG. 3 is a plan view for showing the circuit board assembly employed in the rectifier indicated in FIG. 1. FIG. 4 is a sectional view of the rectifier shown in FIG. 2, taken along a line IV—IV of FIG. 2.

In FIG. 1 to FIG. 4, a positive heat sink 30 functioning as a first heat sink is made of aluminium. This positive heat sink 30 contains a arcuate body 30a, a plurality of heat radiating fins 30b, positioning guide portions 30c, and a plurality of positive diode mounting portions 30d. The plural heat radiating fins 30b stand upright on a rear surface of this arcuate body 30a. The positioning guide portions 30 are extended from three portions of this arcuate body 30a, namely both ends and a center of the arcuate body outwardly along a radial direction. The plural positive diode mounting portions 30d are formed as concaves in a major surface of the arcuate body 30a along a circumferential direction thereof. Then, a plurality of positive diodes 33 are mounted on the major surface of the arcuate body 30a in such a manner that these positive diodes 33 are joined to the respective negative diodes mounting portions 30d.

A negative heat sink 31 functioning as a second heat sink is made of aluminum, and contains another arcuate body 31a, guide portions 31b, and a plurality of negative diode mounting portions 31c. The guide portions 31b are provided on three portions of this arcuate body 31a, namely both ends and a center portion thereof. The plural negative diode mounting portions 31c are formed as concaves on a major surface of the arcuate body 31a along a circumferential direction. Then, a plurality of negative diodes 34 are mounted on the major surface of the arcuate body 31a along the circumferential direction in such a manner that these diodes 34 are joined to the respective negative diode mounting portions 31c. In this case, the negative diode mounting portions 31c are formed with a preselected amount of offset along the circumferential direction with respect to the positive diode mounting portions 30d.

A circuit board assembly 32 is constructed of a resin member 36 formed in a arcuate shape and guide portions 36a formed on three portions of this resin member 36, i.e., both ends and a center portion thereof. This resin member 36 is made of an iron circuit board molded by polyphenylene sulfide resin (PPS). Then, connection terminals 37 of the circuit board assembly 32 are exposed from the resin member 36 at a plurality of positions thereof along a circumferential direction, and the respective connection terminals 37 are branched and exposed from the inside and the outside of the resin member 36.

It should be understood that the expression "arcuate shape" indicates a circular arc shape formed by notching a portion of an annular-shaped plane plate.

The positive diode 33 is constituted in such a manner that an IC chip 33a is soldered on a copper base 33b to be joined, a relay lead 33c made of copper is soldered on the IC chip 33a to be joined, and further a lead 33d made of copper is soldered on the relay lead 33c to be joined, and these members are molded by resin. Then, the lead 33d is extended from a sealing resin member 33e, is bent in an L-shape on the root side of the extended lead portion, and further a tip portion is twice bent in an L-shape, by which a bend portion 38 is formed.

Also, the negative diode 34 is formed in a similar manner to the above-explained positive diode 33.

To assemble a rectifier 50 arranged in the above-described manner, while the lead 33d of the positive diode 33 is directed toward an outer circumference side, the copper base 33b is soldered/jointed to each of the positive diode mounting portions 30d of the positive heat sink 30. Similarly, while a lead 34d of the negative diode 34 is directed toward an inner circumference side, a copper base 34b is soldered/jointed to each of the negative diode mounting portions 31c of the negative heat sink 31. Then, the guide portions 30c of the positive heat sink 30 are overlapped via an insulating ring 35 to the guide portions 31b of the negative heat sink 31. Furthermore, the guide portions 36a of the circuit board assembly 32 are overlapped on the guide portion 30c of the positive heat sink 30. Thereafter, fastening bolts (not shown in detail) are inserted under pressure into holes of the guide portions 30c, 31b, 36a, so that the positive heat sink 30, the negative heat sink 31, and the circuit board assembly 32 are positioned to be formed in an integral form.

At this time, the arcuate body 30a of the positive heat sink 30 is positioned on the inner circumferential side of the arcuate body 31a of the negative heat sink 31, and the major surfaces of both the arcuate bodies 30a and 31a are located at the same plane. The positive diode 33 is offset by a preselected amount along the circumferential direction with respect to the negative diode 34. Then, the lead 33d of the positive diode 33 passes through a side of the sealing resin member 34e of the negative diode 34, and a tip portion of this lead 33d abuts against an exposed portion 37b branched from the connection terminal 37 of the circuit board assembly 32 on the outer circumferential side. On the other hand, the lead 34d of the negative diode 34 passes through a side of the sealing resin member 33e of the positive diode 33, and a tip portion of this lead 33d abuts against an exposed portion 37a branched from the connection terminal 37 of the circuit board assembly 32 on the inner circumferential side.

Then, the lead 33d of the positive diode 33 is joined to the exposed portion 37b branched from the connection terminal 37 of the circuit board assembly 32 to form an integral body by means of the projection welding from the outer circumferential side, and furthermore, the lead 34d of the negative diode 34 is joined to the exposed portion 37a branched from the connection terminal 37 of the circuit board assembly 32 to form an integral body by means of the projection welding from the inner circumferential side, so that the rectifier 50 is assembled.

The rectifier 50 assembled in the above-explained manner is mounted on a rear bracket 13 in a coaxial manner to a rotation shaft 8 in such a way that an inner circumferential edge surface of the arcuate body 30a of the positive heat sink 30 is positioned along a slip ring 9 of the rotation shaft 8.

As described above, in accordance with this embodiment 1, since the positive diode 33 is offset by a preselected amount along the circumferential direction with respect to the negative diode 34, the lead 33d can pass through the side of the negative diode 34, and the lead 34d can pass through the side of the positive diode 33. As a result, both the positive diode 33 and the negative diode 34 can be arranged in such a manner that shoulder portions thereof abut with each other. Therefore, the outer diameter of the arcuate body 31a of the negative heat sink 31 could be reduced by approximately 20%, as compared with the conventional rectifier in which the lead 33d abuts against the lead 34d.

Also, the bending position where the lead 33d (34d) is extended from the sealing resin member 33e (34e), and thereafter is bent in the L-shape can be separated from the side surface of the sealing resin member 33e (34e) without increasing the dimension along the radial direction. As a consequence, the stress applied to the IC chip 33a (34a) when the lead 33d (34d) is bending-processed can be reduced. Also, even when the vibrations produced by the automobile are transferred to the lead 33e (34e), there is no fear that force would concentrate at the root portion of the lead 33e (34e), so that breakage failures of the lead 33d (34d) and the IC chip 33a (34a) can be prevented, resulting in improved reliability.

Further, the lead 33d (34d) is extended from the sealing resin member 33e (34e), and then is bent in the L-shape on the root side of this extended portion, and furthermore the tip portion thereof is bent two times in the L-shape, so that the bending portion 38 is formed. The vibrations produced by the automobile are absorbed by this bending portion 38, resulting in an improvement of vibration resistance.

Also, the connection terminals 37 of the circuit board assembly 32 are branched to be exposed on the inner circumferential side and the outer circumferential side of the resin member 36, the lead 33d of the positive diode 33 is integrally joined to the exposed portion 37b branched from the connection terminal 37 from the outer circumferential side by means of the projection welding, and further the lead 34d of the negative diode 34 is integrally joined to the exposed portion 37a branched from the connection terminal 37 from the inner circumferential side by means of the projection welding. The heat generated at the boundary surfaces between the leads 33d, 34d and the connection terminals 37 when the different sorts of metals are joined with each other by means of the projection welding is diffused via the exposed portions 37a and 37b of the connection terminal 37, it can avoid such a condition that the heat is reserved into these exposed portions 37a and 37b to thereby increase the temperatures of the exposed portions. Accordingly, no cavity is produced in the center portions of the exposed portions 37a and 37b of the connection terminal 37, resulting in an improvement of reliability in the welding operation. Also, the exposed portions 37a and 37b of the connection terminal 37 are made of thinner plates, so that the manufacturing yield of the material can be increased, and the dimension along the radial direction can be reduced.

It should be understood that the above-described embodiment 1 has described such that the positive diode 33 is mounted on the arcuate body 30a of the first heat sink 30, whereas the negative diode 34 is mounted on the arcuate body 31a of the second heat sink 31. Alternatively, the negative diode 34 may be mounted on the arcuate body 30a of the first heat sink 30, and the positive diode 33 may be mounted on the arcuate body 31a of the second heat sink 31, resulting in achieved similar effect.

Embodiment 2

Figure 5:
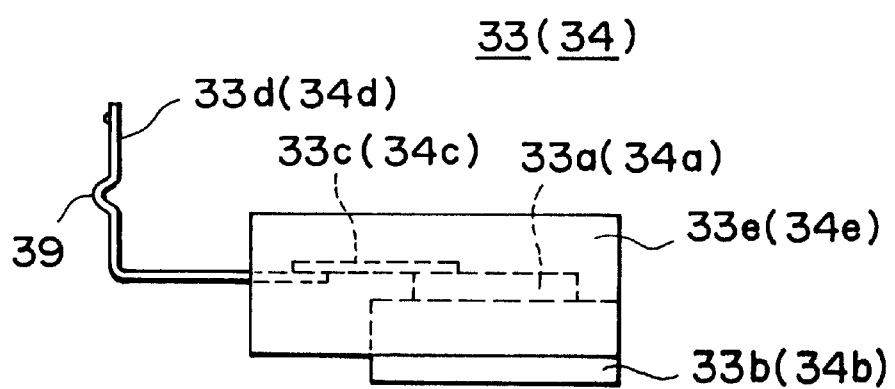
FIG. 5 is a side view for indicating a diode applied to a rectifier according to an embodiment 2 of the present invention.
Figure 6:
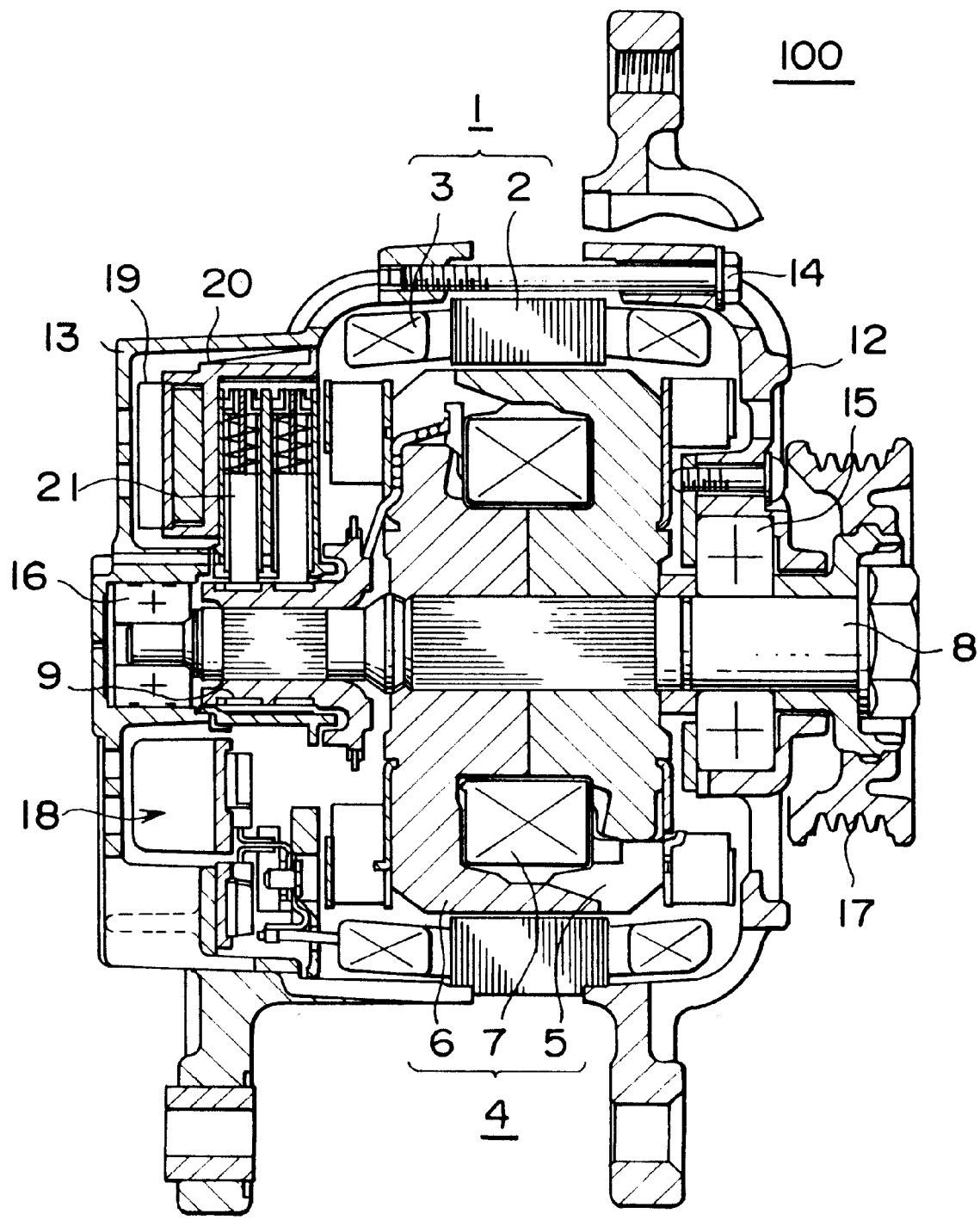
FIG. 6 is a structural diagram for representing an automobile AC generator.
Figure 7:
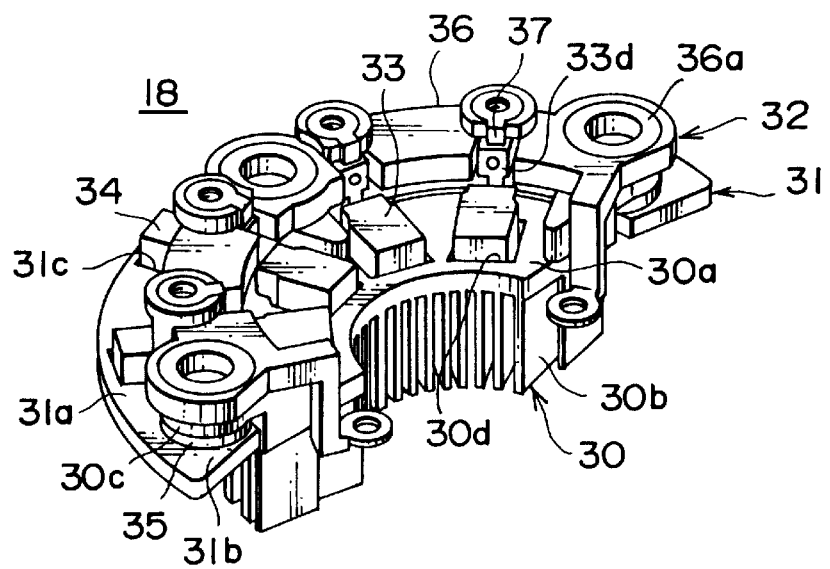
FIG. 7 is a perspective view for indicating the conventional rectifier.
Figure 8:
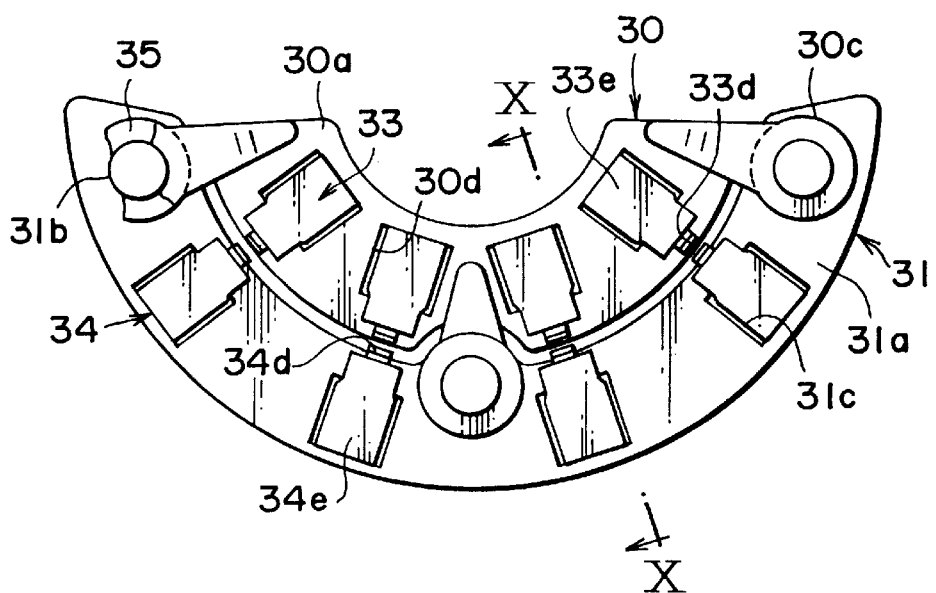
FIG. 8 is a plan view for showing such a condition that the circuit board assembly has been removed from the conventional rectifier.
Figure 9:
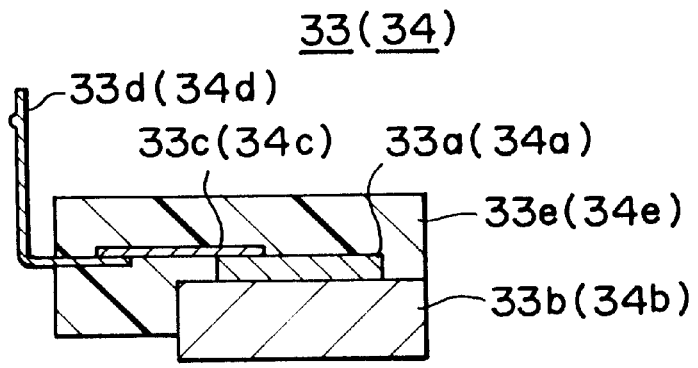
FIG. 9 is a sectional view for representing the diode applied to the conventional rectifier.
Figure 10:
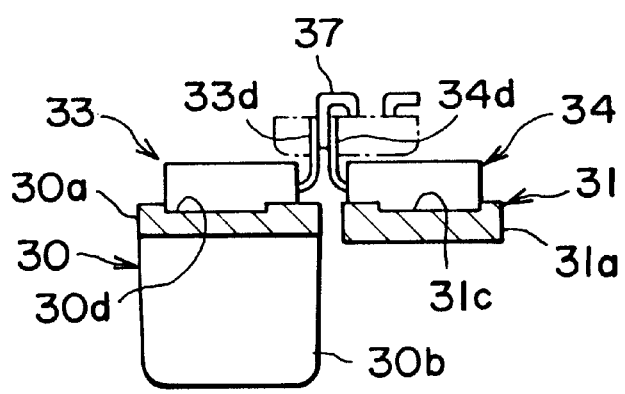
FIG. 10 is a sectional view for showing the conventional rectifier, taken along the line X—X of FIG. 8.

As represented in FIG. 5, in a rectifier according to an embodiment 2 of the present invention, a bending portion 39 is formed in the lead 33d of the positive diode 33, and further in the lead 34d of the negative diode 34. Other structures of this embodiment 2 are made similar to those of the embodiment 1.

In accordance with this embodiment 2, since the bending portion 39 is formed in the lead 33d (34d), the vibrations produced by the automobile can be absorbed by this bending portion 39, so that vibration resistance can be improved similar to the above-explained embodiment 1.

Also, in accordance with this embodiment 2, a position where the lead 33d (34d) is extended from the sealing resin member 33e (34e) and thereafter is bent in an L-shape can be further separated from the side surface of the sealing resin member 33e (34e), as compared with the position of the embodiment 1. As a consequence, it is possible to considerably reduce the stress applied to the IC chip 33a (34a) when the lead 33d (34d) is bent, and also such force that vibrations generated by the automobile are transferred to the lead 33e (34e) and thereafter is concentrated at the root portion of the lead 33d (34d).

Since the rectifier of the automobile AC generator according to the present invention is arranged as explained above, the below-mentioned effects can be achieved.

That is, the rectifier of the automobile AC generator according to the present invention is arranged by comprising: a first metal heat sink having a arcuate body and a guide portion formed on the arcuate body in an integral body; a second metal heat sink having a arcuate body and a guide portion formed on the arcuate body in an integral body, the second metal heat sink being coaxially arranged with the first metal heat sink in such a manner that the guide portion thereof is overlapped via an insulating member over the guide portion of the first metal heat sink, a major surface of the arcuate body thereof is positioned at the same plane as a major surface of the arcuate body of the first metal heat sink, and an inner circumferential end surface of the arcuate body thereof is positioned opposite to an outer circumferential end surface of the arcuate body of the first metal heat sink; a circuit board assembly having a circuit board containing a plurality of connection terminals, a arcuate resin member for molding the circuit board in such a manner that the plurality of connection terminals are exposed, and a guide portion formed on the resin member in an integral body, the circuit board assembly being arranged in such a manner that the guide portion thereof is overlapped with one of the guide portions of the first and second metal heat sinks, and the resin member is positioned opposite to the major surfaces of both the arcuate bodies of the first and second metal heat sinks; a plurality of positive diodes mounted on the major surface of one heat sink between the first and second metal heat sinks along a circumferential direction, each of the positive diodes having a metal base, an IC chip joined onto the metal base, a sealing resin member for molding the IC chip, and a lead whose one end is electrically connected to the IC chip and the other end is extended from the sealing resin member, the metal base being joined onto the major surface of the arcuate body of the one heat sink, and the other end of the lead being joined onto the connection terminal of the circuit board; and a plurality of negative diodes mounted on the major surface of the other heat sink between the first and second metal heat sinks along a circumferential direction, each of the negative diodes having a metal base, an IC chip joined onto the metal base, a sealing resin member for molding the IC chip, and a lead whose one end is electrically connected to the IC chip and the other end is extended from the sealing resin member, the metal base being joined onto the major surface of the arcuate body of the other heat sink, the other end of the lead being joined onto the connection terminal of the circuit board; in which the rectifier is coaxially mounted on a rotation shaft of the AC generator in such a manner that the major surfaces of the arcuate bodies of the first and second metal heat sinks are intersected at a right angle with an axis of the rotation shaft of the AC generator; wherein: each of the connection terminals of the circuit board is branched to be exposed on an inner circumferential side and an outer circumferential side of the resin member; each of leads of the diodes mounted on the major surface of the arcuate body of the first metal heat sink along the circumferential direction is extended from the sealing resin member along a direction of the arcuate body of the second metal heat sink, and thereafter is bent in a direction along which the lead is separated from the major surface of the arcuate body of the second metal heat sink, and other end thereof is joined onto an exposed portion of the connection terminal exposed on the outer circumferential side of the resin member; and each of the diodes mounted on the major surface of the arcuate body of the second metal heat sink along the circumferential direction is offset along the circumferential direction with respect to each of the diodes mounted on the major surface of the arcuate body of the first metal heat sink, respectively, each of the leads thereof is extended from the sealing resin member along the arcuate body of the first metal heat sink, and thereafter is bent in a direction along which the lead is separated from the major surface of the arcuate body of the first metal heat sink, and other end thereof is joined onto an exposed portion of the connection terminal exposed on the inner circumferential side of the resin member. As a consequence, the rectifier can be made compact with maintaining the required performance, and further the reliability thereof can be improved.

Also, each of the leads of the diodes mounted on the major surfaces of the arcuate bodies of the first and second heat sinks has at least one bent portion formed on the position between a joint portion joined to the exposed portion of the connection terminal, and a bending portion in which each of the leads is extended from the sealing resin member along a direction of the arcuate body of either the first heat sink or the second heat sink and thereafter is bent in a direction along which each of the leads bent portion is separated from the major surface of the arcuate body of either the second heat sink or the first heat sink. As a result, vibration resistance of this rectifier can be improved.

What is claimed is:

1. A rectifier of an automobile AC generator, comprising:

a first metal heat sink having a arcuate body and a guide portion formed on said arcuate body in an integral body;

a second metal heat sink having a arcuate body and a guide portion formed on said arcuate body in an integral body, said second metal heat sink being coaxially arranged with said first metal heat sink in such a manner that said guide portion thereof is overlapped via an insulating member over said guide portion of the first metal heat sink, a major surface of said arcuate body thereof is positioned at the same plane as a major surface of said arcuate body of said first metal heat sink, and an inner circumferential end surface of said arcuate body thereof is positioned opposite to an outer circumferential end surface of said arcuate body of said first metal heat sink;

a circuit board assembly having a circuit board containing a plurality of connection terminals, a arcuate resin member for molding said circuit board in such a manner that said plurality of connection terminals are exposed, and a guide portion formed on said resin member in an integral body, said circuit board assembly being arranged in such a manner that said guide portion thereof is overlapped with one of said guide portions of said first and second metal heat sinks, and said resin member is positioned opposite to the major surfaces of both the arcuate bodies of said first and second metal heat sinks;

a plurality of positive diodes mounted on said major surface of one heat sink between said first and second metal heat sinks along a circumferential direction, each of said positive diodes having a metal base, an IC chip joined onto said metal base, a sealing resin member for molding said IC chip, and a lead whose one end is electrically connected to said IC chip and the other end is extended from said sealing resin member, said metal base being joined onto the major surface of the arcuate body of said one heat sink, and the other end of said lead being joined onto the connection terminal of said circuit board; and a plurality of negative diodes mounted on said major surface of the other heat sink between said first and second metal heat sinks along a circumferential direction, each of said negative diodes having a metal base, an IC chip joined onto said metal base, a sealing resin member for molding said IC chip, and a lead whose one end is electrically connected to said IC chip and the other end is extended from said sealing resin member, said metal base being joined onto the major surface of the arcuate body of said other heat sink, the other end of said lead being joined onto the connection terminal of said circuit board; in which said rectifier is coaxially mounted on a rotation shaft of said AC generator in such a manner that the major surfaces of the arcuate bodies of said first and second metal heat sinks are intersected at a right angle with an axis of said rotation shaft of the AC generator; wherein:

each of said connection terminals of said circuit board is branched to be exposed on an inner circumferential side and an outer circumferential side of said resin member;

each of leads of said diodes mounted on the major surface of the arcuate body of said first metal heat sink along the circumferential direction is extended from said sealing resin member along a direction of the arcuate body of said second metal heat sink, and thereafter is bent in a direction along which said lead is separated from the major surface of the arcuate body of said second metal heat sink, and other end thereof is joined onto an exposed portion of said connection terminal exposed on the outer circumferential side of said resin member; and each of said diodes mounted on the major surface of the arcuate body of said second metal heat sink along the circumferential direction is offset along the circumferential direction with respect to each of said diodes mounted on the major surface of the arcuate body of said first metal heat sink, respectively, each of said leads thereof is extended from said sealing resin member along the arcuate body of said first metal heat sink, and thereafter is bent in a direction along which said lead is separated from the major surface of the arcuate body of said first metal heat sink, and other end thereof is joined onto an exposed portion of said connection terminal exposed on the inner circumferential side of said resin member.

2. A rectifier of an automobile AC generator as claimed in claim 1 wherein:

each of the leads of said diodes mounted on the major surfaces of the arcuate bodies of said first and second metal heat sinks has at least one bent portion formed on the position between a joint portion joined to the exposed portion of said connection terminal, and a bending portion in which each of said leads is extended from said sealing resin member along a direction of the arcuate body of either said first heat sink or said second heat sink and thereafter is bent in a direction along which each of said leads is separated from the major surface of the arcuate body of either said second heat sink or said first heat sink.

* * * * *